(12) United States Patent
Phair et al.

(10) Patent No.: US 9,964,672 B2
(45) Date of Patent: May 8, 2018

(54) METHOD FOR OPTIMIZING A PIEZOELECTRIC ACTUATOR STRUCTURE FOR A DEFORMABLE LENS

(71) Applicant: Polight AS, Horten (NO)

(72) Inventors: John Phair, Tønsberg (NO); Paul Muralt, La Sarraz (CH)

(73) Assignee: Polight AS, Horten (NO)

( * ) Notice: Subject to any disclaimer, the term of this patent is extended or adjusted under 35 U.S.C. 154(b) by 420 days.

(21) Appl. No.: 14/430,344

(22) PCT Filed: Sep. 18, 2013

(86) PCT No.: PCT/EP2013/069390
§ 371 (c)(1),
(2) Date: Mar. 23, 2015

(87) PCT Pub. No.: WO2014/048818
PCT Pub. Date: Apr. 3, 2014

(65) Prior Publication Data
US 2015/0285962 A1    Oct. 8, 2015

(30) Foreign Application Priority Data

Sep. 27, 2012 (EP) ................... 12186316

(51) Int. Cl.
*G02B 3/14* (2006.01)
*G03B 3/10* (2006.01)
(Continued)

(52) U.S. Cl.
CPC ................. *G02B 3/14* (2013.01); *G03B 3/10* (2013.01); *H01L 41/047* (2013.01);
(Continued)

(58) Field of Classification Search
CPC ........... G02B 3/14; G02B 3/10; H01L 41/047; H01L 41/0973; Y10T 29/42
See application file for complete search history.

(56) References Cited

U.S. PATENT DOCUMENTS 5,451,769 A     9/1995  McAdoo et al.
5,581,144 A *  12/1996  Corl ..................... B06B 1/0655
                                                      310/334

(Continued)

FOREIGN PATENT DOCUMENTS

EP      2 199 836 A1      6/2010
EP      2 115 500 B1     11/2011
JP     2006-197731 A *    7/2006 ............... G02B 3/14

OTHER PUBLICATIONS

Myers, Oliver J. et al., "Designing Piezoelectric Interdigitated Microactuators Using Finite Element Analysis" Journal of Mechanical Design, Jun. 2010, pp. 061004-1-061004-11, vol. 132.

(Continued)

*Primary Examiner* — Peter DungBa Vo
*Assistant Examiner* — Jeffrey T Carley
(74) *Attorney, Agent, or Firm* — Knobbe, Martens, Olson & Bear, LLP (57) ABSTRACT

The present invention comprises a system and a method thereof for identifying a specific Interdigitated Electrode pattern arrangement for piezoelectric actuators located around an aperture of a flexible lens body, wherein the Interdigitated Electrode configuration is configurable, when activated, to provide a specific definable bending force distribution, thereby providing a specific definable shaping of the flexible lens body, thereby providing specific definable optical characteristics of the flexible lens body.

17 Claims, 5 Drawing Sheets

(51) Int. Cl.
*H01L 41/047* (2006.01)
*H01L 41/09* (2006.01)

(52) U.S. Cl.
CPC .. *G03B 2205/0061* (2013.01); *H01L 41/0973* (2013.01); *Y10T 29/42* (2015.01)

(56) References Cited

U.S. PATENT DOCUMENTS

| | | | | |
|---|---|---|---|---|
| 7,733,198 | B1* | 6/2010 | Olsson | G10K 11/20 333/187 |
| 8,027,096 | B2* | 9/2011 | Feng | G02B 3/14 235/454 |
| 8,194,307 | B2* | 6/2012 | Arnold | G02B 3/0087 359/307 |
| 2011/0061215 | A1* | 3/2011 | Defay | H01L 41/29 29/25.35 |
| 2011/0148992 | A1* | 6/2011 | Miyazawa | B41J 2/161 347/68 |
| 2011/0149409 | A1 | 6/2011 | Haugholt et al. | |
| 2012/0053393 | A1 | 3/2012 | Kaltenbacher et al. | |

OTHER PUBLICATIONS

Ouyang, Guangmin et al., "Electroactive polymer-based spatial light modulator with high reliability and fast response speed" Optical Engineering, Dec. 2011, pp. 124001-1-124001-4, vol. 50, No. 12.

International Search Report for PCT/EP2013/069390 dated Dec. 4, 2013.

* cited by examiner

METHOD FOR OPTIMIZING A PIEZOELECTRIC ACTUATOR STRUCTURE FOR A DEFORMABLE LENS

CROSS REFERENCE TO RELATED APPLICATIONS

This application is a U.S. National Phase Application of PCT International Application Number PCT/EP2013/069390, filed on Sep. 18, 2013, designating the United States of America and published in the English language, which is an International Application of and claims the benefit of priority to European Patent Application No. 12186316.1, filed on Sep. 27, 2012. The disclosures of the above-referenced applications are hereby expressly incorporated by reference in their entireties.

FIELD OF THE INVENTION

The present invention relates to piezoelectric elements and especially to piezoelectric elements arranged in an Interdigitated Electrode configuration on a surface of a micro-tunable lens body, wherein the piezoelectric elements are configurable to provide a desired shaping of the micro-tunable lens body when activated.

BACKGROUND OF THE INVENTION

The worldwide growth in the use of mobile phones, digital scanning apparatus, medical instruments, and security and surveillance devices etc. containing cameras is driving the demand for improvements and developments of existing camera technology.

To meet demands from a user perspective (such as larger focal range, greater operating optical versatility and focusing speed), and from a manufacturing perspective (such as reducing the material processing requirements/limitations for device design and cost of manufacture), further improvements to existing optical device designs are required. Improvements to the design of existing micro-tunable lenses for example are critical to ensure that the devices are more readily suitable for its target application in high-volume consumer electronic devices (e.g. cameras within mobilephones, PC's, digital scanners, etc.).

An example of an improved micro-tunable lens is disclosed in the patent EP 2115500 with the title "Flexible lens assembly with variable focal length" having a flexible lens body 10 in a cavity bounded by a sidewall 11 and a first transparent cover 13, and a second transparent cover 14, wherein both covers 13, 14 are in contact with respective surfaces of the lens body 10. Piezoelectric elements 12 are shaping the lens body 10 when activated, thereby adjusting for example the focal length of the lens assembly.

There are some examples of manufactured exemplars of the above referenced flexible lens assembly that are 0.4 mm thick. It is also possible to achieve even smaller exemplars of this design. The movement of the lens body shape, when the piezoelectric elements are shaping the body, is in the μm range when adjusting the focus length from infinity to for example 10 cm. Therefore, this design is an example of an extremely slim design configurable to be used in a camera module for example. Embodiments of the flexible lens assembly according to the patent EP 2115500 are sold under the trade name TLens™. An example of embodiment of a TLens™ chip is disclosed on the web page http://www.po-light.com/tlens-13.html.

Figure 2:
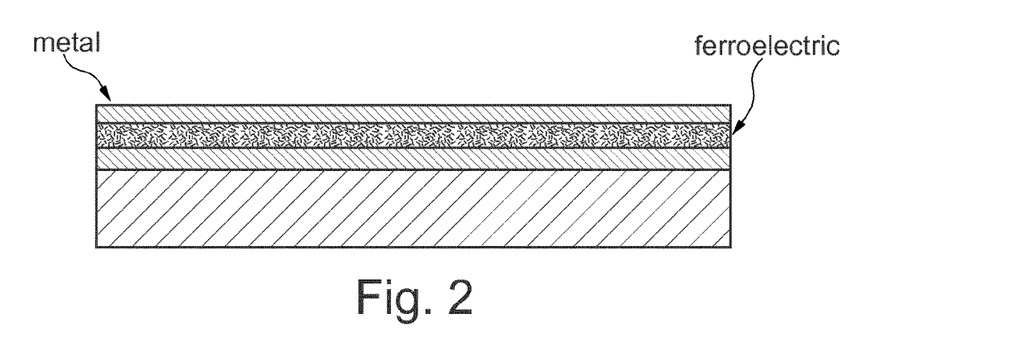
FIG. 2 illustrates an example of prior art.

The referenced example of an improved micro-tunable lens utilizes piezoelectric electrodes of a conventional design, i.e. an upper and a lower metal layer with a ferro-electric layer in between the two metal layers (ref. FIG. 2). This type of piezoelectric electrode has proved to be able to provide autofocus capability for camera systems, and is regarded as a replacement technology for the more common Voice Coil Motor (VCM) systems in use in mobile phone cameras. It is further known that the same type of piezoelectric electrode configurations can be used in Optical Image Stabilization systems, for example as disclosed in the European Patent application EP 08712670.

Figure 1:
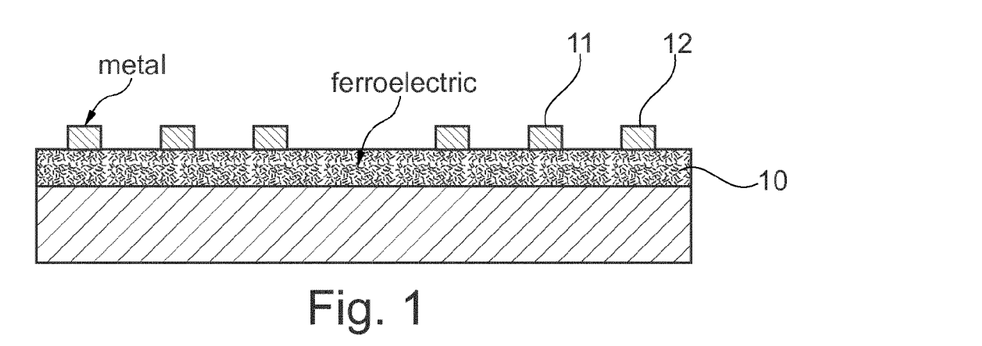
FIG. 1 illustrates an example of embodiment of the present invention.

From a manufacturing point of view, a piezoelectric electrode with fewer layers would be beneficial. In prior art it is known an electrode configuration named Interdigitated Electrodes that can be manufactured with for example respective positive and negative electrodes that are located spaced apart from each other on top of a ferroelectric layer surface on top of an insulating substrate (ref. FIG. 1).

The patent application US 2012/0053393 by Dominik Kaltenbacher et. al. discloses a sound transducer for producing sound waves, which can be inserted into an ear. FIG. 6 of this publication illustrates a piezoelectric electrode configuration with parallel positive and respective negative electrodes spaced apart on top of a piezoelectric layer which rest on top of a sound membrane member. FIG. 6 also discloses how the electric field lines between the electrodes penetrates the ferroelectric (piezoelectric) layer, and the piezoelectric effect manifests itself when, for example, alternating voltages are applied on the electrodes, and the length of the piezo crystals are respectively lengthened or shortened, thereby producing a bending upwards or downwards of the surface, which then are mechanically transferred to the sound membrane member which then can reproduce sound. However, since the electrodes are positioned on top of the ferroelectric layer, there will be no electric field directly under the surface of the electrodes facing the ferroelectric layer. Therefore, the electric field lines penetrating the ferroelectric (piezoelectric) layer are shaped with a curved shape in between the electrodes. Therefore, there will not be any suitable piezoelectric effect just underneath the electrodes themselves. The areas in which this phenomenon occurs are often referred to as "dead zones". The effect is that the bending of the surface (i.e. the sound membrane in this example) is non-uniform. When reproducing sound, this is not a problem. It is the vibration of the membrane which is important, as known to a person skilled in the art.

U.S. Pat. No. 5,451,769 disclose a high speed photo detector that in an example of embodiment as depicted in FIG. 3 is arranged with an Interdigitated Electrode configuration comprising two electrodes of opposite polarity, wherein each respective electrode comprises a radially oriented electrode part wherein circle shaped parts are connected and which constitutes rings around the centre of the photo detector. However, this configuration has also dead zones, but the specific application of the Interdigitated Electrode does not affect the performance of the application as part of a photo detector.

Therefore, if an Interdigitated Electrode configuration for example should replace a conventional piezoelectric actuator in the example of a micro-tunable lens as disclosed in the patent EP 2115500 referenced above, the optical quality would probably be degraded significantly due to the possible dead zone effect of the Interdigitated Electrode configuration (uneven shaping of the lens body).

However, the possible benefits and advantages that could be achieved by utilizing an Interdigitated Electrode configuration on top of a flexible lens body would not only reduce the thickness of the piezoelectric actuators because of fewer layers, but also, for example with reference to the examples of embodiments disclosed in EP 2115500, because the bendable glass cover 13 can serve as an insulating layer, wherein a ferroelectric material can be deposited on the surface followed by deposition of the electrode configuration on top of the ferroelectric layer. This simplifies the manufacturing of the micro-tunable lens significantly. Further, it is known that the bending force of an Interdigitated Electrode configuration may provide an increase in the possible maximum bending forces.

According to an aspect of the present invention, a micro-tunable lens with Interdigitated Electrode configured piezoelectric actuators may achieve improved optical performance and versatility if the electrodes are arranged in a configured array providing a mitigation of the dead zone phenomena of Interdigitated Electrodes.

Hence, an improved piezoelectric actuator configuration would be advantageous, and in particular it would be more efficient to manufacture a micro-tunable lens which has an improved piezoelectric actuator configuration, and which would provide the following examples of improvements:

i) Designing piezoelectric actuator element(s) with an Interdigitated Electrode pattern configurable to provide a bending force distribution across a flexible lens surface area of a pre-determined and desired uniformity. Such a bending force may be configurable to be homogenous in order to provide an increased focal length compared to prior art solutions. It is also within the scope of the present invention that the Interdigitated Electrode pattern is configurable to provide non-homogeneous (distorted) bending force distribution in order to compensate optical effects and aberrations (or lens faults), or otherwise due to specific device application requirements.

ii) Designing piezoelectric element(s) and electrode configurations with minimal piezoelectric layer thickness and/or operating voltage requirements. These are critical design issues.

iii) Designing piezoelectric element(s) and electrode configurations within a micro-tunable lens with as few layers as possible. This reduces the number of manufacturing steps, materials and components and therefore the associated cost.

OBJECT OF THE INVENTION

It is a further object of the present invention to provide an alternative to the prior art.

In particular, it may be seen as an object of the present invention to provide an Interdigitated Electrode configuration comprising piezoelectric actuator(s) used in a micro-tunable lens that solves the above mentioned problems of the prior art with a configurable array of electrodes providing a definable symmetrical or non-symmetrical shaping of the lens body.

SUMMARY OF THE INVENTION

Thus, the above described object and several other objects are intended to be obtained in a first aspect of the present invention by providing a system and a method of identifying a specific Interdigitated Electrode pattern comprising piezoelectric actuators located around an aperture of a flexible lens body, or example made out of transparent polymer, wherein the Interdigitated Electrode configuration is configurable, when activated, to provide a specific definable bending force distribution, thereby providing a specific definable shaping of the flexible lens body, thereby providing specific definable optical characteristics of the flexible lens body.

By an aperture of a flexible lens body is in the present context to be construed widely, such as an absence of electrodes on the lens body and not necessarily a physical opening as such.

The invention is particularly, but not exclusively, advantageous for obtaining a micro-tunable flexible lens comprising a piezoelectric electrode pattern being identified by a method of optimizing piezoelectric actuator shaping of the micro-tunable lens body, comprising steps of:

arranging concentric partly ring-shaped piezoelectric elements comprising electrodes configured on a surface of a piezoelectric material deposited on a surface of a flexible lens body, thereby constituting piezoelectric actuators on the surface of the flexible lens body around a central located transparent part of the lens body, wherein the piezoelectric actuators comprise a first positive electrode and a second negative electrode, each comprising a radially configured electrode part configured with branches of concentric partly ring-shaped electrodes surrounding the transparent part of the lens body, branches of the positive electrode and negative electrode are arranged sequentially with opposite polarity and in a parallel configuration, or optionally partly non-parallel, with respective different distances from the transparent part or optical axis of the lens body, wherein the method further comprises:

applying a simulation model executable in a computer system, the model being adapted to simulate a resulting shaping of the lens body surface according to simulated applied voltages to the electrodes of the piezoelectric elements in an initial arrangement of the electrodes on the flexible lens body surface, the iterative process further comprising modifying the initial arrangement of the electrodes of the piezoelectric elements by applying a first electrical connection between branches of the first concentrically configured electrode part and applying a first electrical connection between branches of the second concentrically configured electrode part, wherein the simulation model is applied to re-simulate a resulting shaping of the lens body surface according to simulated applied voltages to the electrodes of the piezoelectric elements, and when applying a radial electrical connection between two branches of one concentrically oriented electrode part, an opening in the branch of opposite polarity of the other concentrically oriented electrode part, being arranged in between the two branches, is provided for, thereby allowing the passing of the radial electrical connection, then continuing the iteration process by modifying the arrangement of the electrodes and applying further electrical connections between concentric branches of the first electrode part and between concentric branches of the second electrode part of the piezoelectric elements, and where the simulation model is applied in each iterative step to re-simulate a resulting shaping of the lens body surface according to simulated applied voltages to the electrodes of the piezoelectric elements, where each iteration step comprises:
a) randomly selecting an electrical connection of the first electrode part and moving the connection in a randomly selected direction around the branches to which the electrical connection is connected to,
b) when the electrical connection is moved, an opening arranged in the second electrode part arranged between two branches of the first electrode part, which the electrical connection of the first electrode would be passing when moved, then moving the electrical connection together with the opening to a randomly selected location,
c) randomly selecting an electrical connection of the second electrode part and moving the connection in a randomly selected direction around the branches to which the electrical connection is connected to,
d) when the electrical connection is moved, an opening arranged in the first electrode part arranged between the two branches of the second electrode part, which the electrical connection of the second electrode would be passing when moved, then moving the electrical connection together with the opening to a randomly selected location,
e) re-simulate a resulting shaping of the lens body surface according to simulated applied voltages to the electrodes of the piezoelectric elements in accordance with the configuration of electrodes provided for by the current iteration step a) and current iteration step b), and comparing the shaping of the lens body surface shape with a defined target shaping, continuing steps a) to e) until the shaping of the lens body surface shape is within a predetermined tolerance with respect to the defined target shaping of the lens body, or alternatively stopping after a predetermined maximum number of iterations.

The invention is particularly, but not exclusively, advantageous for obtaining a computer system configurable to provide optimization of piezoelectric actuator configurations on top of a surface of a flexible lens body, comprising:

an executable physical simulation model of the flexible lens body, wherein the flexible lens body with piezoelectric actuator elements are configured in the simulation model according to a method according to the present invention, an interactive graphical interface providing display of configurations of piezoelectric actuator elements provided for in the simulator model, wherein the interactive graphical interface further provides means for graphical manipulations of configurations of electrodes of the piezoelectric elements, wherein the manipulated configurations of electrodes are used to iteratively update the simulation model of the flexible lens body with piezoelectric actuators in the simulator.

BRIEF DESCRIPTION OF THE FIGURES

The Interdigitated Electrode configuration of a piezoelectric actuator in a micro-tunable lens according to the present invention will now be described in more detail in view of the accompanying figures. The attached figures illustrates examples of embodiments of the present invention and is not to be construed as being limiting to other possible embodiments falling within the scope of the attached claim set.

DETAILED DESCRIPTION OF AN EMBODIMENT

Although the present invention has been described in connection with the specified embodiments, it should not be construed as being in any way limited to the presented examples. The scope of the present invention is set out by the accompanying claim set. In the context of the claims, the terms "comprising" or "comprise" do not exclude other possible elements or steps. Also, the mentioning of references such as "a" or "an" etc. should not be construed as excluding a plurality. The use of reference signs in the claims with respect to elements indicated in the figures shall also not be construed as limiting the scope of the invention. Furthermore, individual features mentioned in different claims, may possibly be advantageously combined, and the mentioning of these features in different claims does not exclude that a combination of features is not possible and advantageous.

With reference to FIG. 1, an Interdigitated Electrode of a general design is disclosed, and which comprises an array of positive electrodes 11 and negative electrodes 12 ordered in sequence of opposing polarities located on or in the piezoelectric layer 10. In theory, a piezoelectric layer utilizing an Interdigitated Electrode is configurable to provide a bending of a flexural actuator in a hetero-morph layer structure (piezoelectric film on top of passive elastic layer), which should give approximately twice as much bending force when compared to a piezoelectric layer of the more conventional parallel plate geometry, for example as disclosed in FIG. 2.

The reason for this is that the actuation force of an Interdigitated Electrode configured piezoelectric element is constituted by the longitudinal piezoelectric coefficient ($d_{33}$), whereas the parallel plate geometry is based on the transverse piezoelectric coefficient ($d_{31}$). Since the d33 of a Lead Zirconate Titanate (a piezoelectric ceramics denoted PZT) is generally two times larger than the d31, this means that the piezoelectric strain in the longitudinal direction is expected to be two times larger than in the transverse direction with the same applied electric field. See for example the reference B. Xu, Y. Ye, L. E. Cross, J. J. Bernstein, R. Miller, "Dielectric and hysteresis from transverse electric fields in lead zirconate titanate thin films," App. Phy. Lett., 74, pp. 3549, 1999. For instance in the bulk ceramics material of type PZT 4, the effective longitudinal piezoelectric coefficient ($e_{33}$)=−14 C/m², and the effective transverse piezoelectric coefficient ($e_{31}$)=−4.1 C/m².

A further advantage of Interdigitated Electrodes is the fact that the piezoelectric stress is compressive in the film plane for the Interdigitated Electrode (positive coefficient $e_{33}$). This is in contrast to the tensile piezoelectric stress in parallel plate geometry (negative coefficient $e_{31}$). Especially, if the film is already under tensile stress (like sol-gel deposited PZT thin films), the Interdigitated Electrode configuration allows for larger amplitudes of the electric field without the risk of providing film cracking.

Theoretical works on cantilevers can be found in the reference Smits, J. G. and W.-S. Choi: "The Constituent equation of piezoelectric heterogeneous bimorphs," IEEE Trans. UFFC, 1991. 38: p. 256-270. Cantilevers deposed on membranes and plates are described in the reference Muralt, P., et al.: "Piezoelectric actuation of PZT thin film diaphragms at static and resonant conditions", Sensors and Actuators A, 1996. 53: p. 397-403; Muralt, P., "Ferroelectric thin films for microsensors and actuators: a review", Micromech. Microeng., 2000. 10(2): p. 136-146; Muralt, P., "Piezoelectric thin films for MEMS". Integrated Ferroelectrics, 1997. 17: p. 297-307; Dubois, M.-A. and P. Muralt, "PZT thin film actuated elastic thin micro motor". IEEE Trans. Ultrasonics, Ferroelectrics, and Frequency Control, 1998. 45(5): p. 1169-1177; Muralt, P., et al., "Piezoelectric micromachined ultrasonic transducers based on PZT thin films". IEEE Trans. UFFC, 2005. 52: p. 2276-88.

Figure 3:
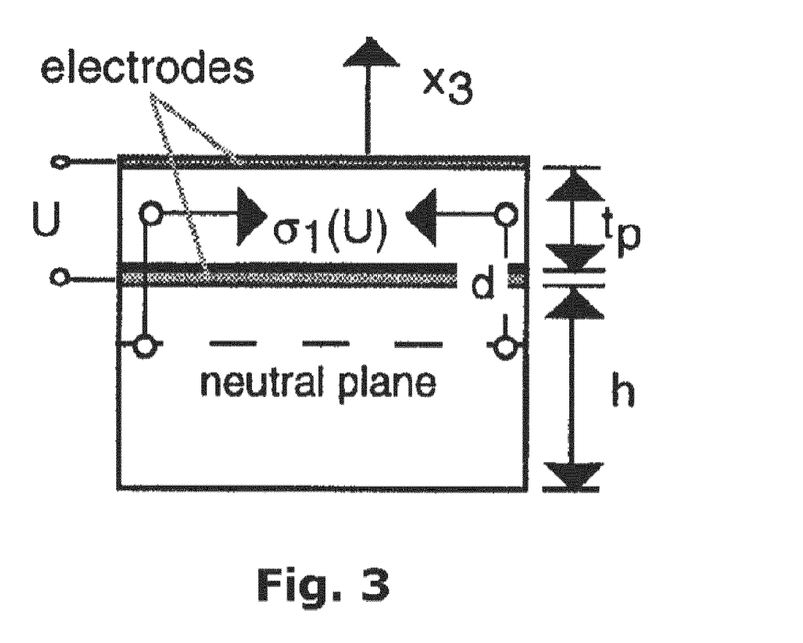
FIG. 3 illustrates an example of an actuator.

The principle is shown in FIG. 3. The piezoelectric stress developed in the thin films exerts a bending moment onto a neutral plane of the elastic plate or cantilever, whereby a bending occurs. FIG. 3 is taken from Muralt, P., "Ferroelectric thin films for micro-sensors and actuators: a review", Micromech. Microeng., 2000. 10(2): p 136-146.

Figure 4A:
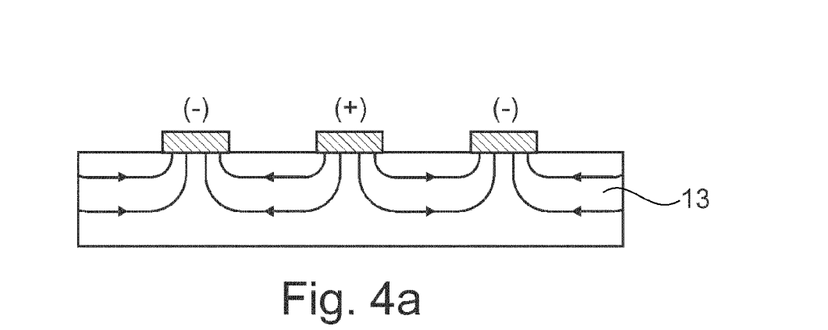
FIG. 4a illustrates field lines of an example of embodiment of the present invention.
Figure 4B:
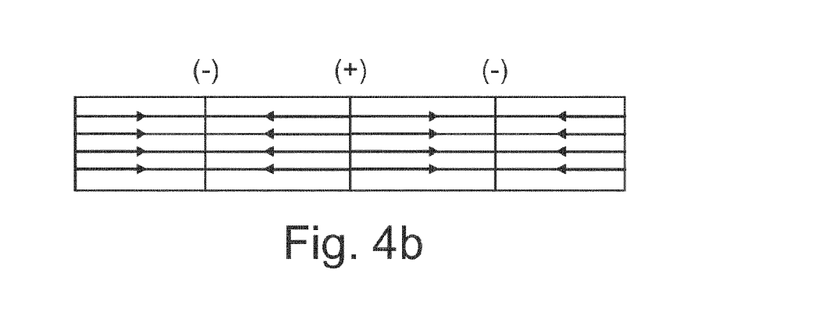
FIG. 4b illustrates an example of preferable field lines.

With reference to FIG. 4a it is disclosed how electric field lines 13 penetrate the piezoelectric material underneath the electrodes on the surface when a signal or voltage is applied on the electrodes with sequentially arranged opposite electric polarity. The FIG. 4a illustrate that the electric field is reduced underneath the electrodes which creates 'dead zones' in the ferroelectric material due to the absences of a suitable oriented electric field (as depicted in FIG. 4b). FIG. 4b illustrates how field lines preferably should be penetrating the material. The Interdigitated Electrode configuration may therefore provide a non-uniform electric field which results in internal stresses and irregular strains in the piezoelectric material. In addition, for example when an Interdigitated Electrode pattern consists of concentric circular or polygonal rings with a common origin, the individual rings must be connected together to complete the electric circuit. The connecting electrical connections are typically out of plane of the concentric circles, and provide passive regions which do not contribute to the actuating force bending the membrane. This is in contrast to a conventional plate geometry which may provide field lines as disclosed in FIG. 4b.

Figure 7:
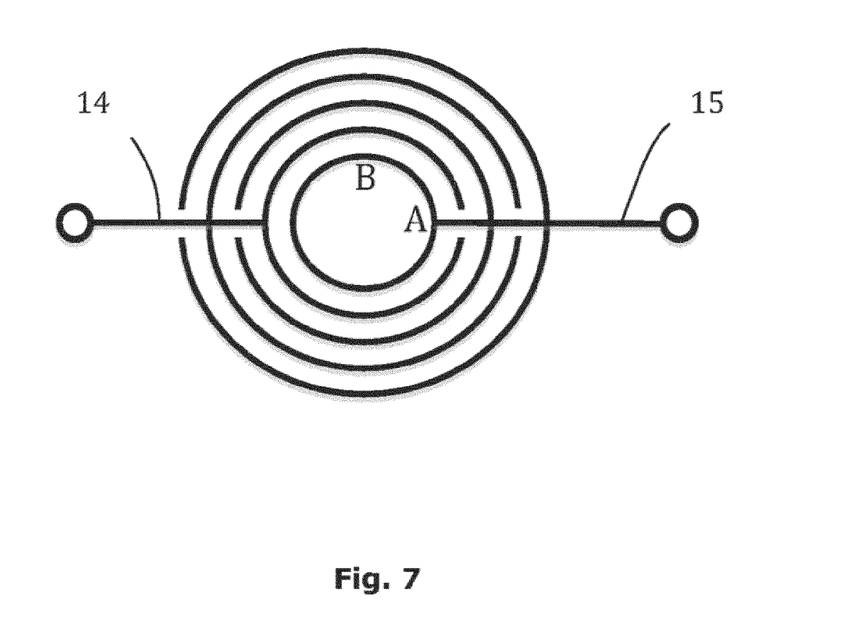
FIG. 7 illustrates a prior art configuration of circular electrodes.

For example in FIG. 7, an electrode pattern is disclosed wherein an aperture of a flexible lens body is in the centre, and the electrodes are arranged as concentric rings (branches) around the aperture. Two radially oriented electrodes 14, 15 with opposite polarity are interconnecting, via electrical connections between the rings (branches), respective concentric rings (branches) belonging to the specific radially oriented electrode, i.e. having the same electric polarity. However, the deflection or bending force at point A in the figure (radially oriented electrode lines does not allow for any force in the preferred direction) is different from that at point B which in this example of configuration of the electrodes may have maximum bending force. The absences of bending force in the preferred direction associated with the radially oriented electrical connections are referred to as 'dead zones' as disclosed above. If a piezoelectric actuator with Interdigitated Electrodes are to be used in a micro-tunable lens, the shape and curvature of the lens during the actuation is highly critical for the quality of optical functions and performance of the lens and the application of the lens.

Thus, if the actuator is designed with an Interdigitated Electrode configuration such as depicted in FIG. 7, non-homogenous bending forces across the surface of the actuator (including the optical aperture of the lens, i.e. the space within the inner most electrode), may result in non-uniform bending of the lens and sub-optimal optical performance.

However, Interdigitated Electrode configurations are beneficial to use in micro-tunable lens applications due to reduced cost and complexity of producing piezoelectric actuators based on Interdigitated Electrode patterns, and the increase in optical performance of lenses that may be achieved due to increasable bending forces by the same actuator configurations.

Therefore, it is an aspect of the present invention to provide a method and system enabling identification of an Interdigitated Electrode configuration on a surface of a flexible lens body, wherein defects due to dead zone problems are controllable in the sense that a bending force uniformity of a certain defined quality (for example smoothness of the lens surface when being shaped by the actuators) can be achieved, and also to provide a defined non-uniform distribution of bending forces providing a certain shaping of the lens body surface, for example being configurable to mitigate lens faults or optical aberrations.

Figure 5:
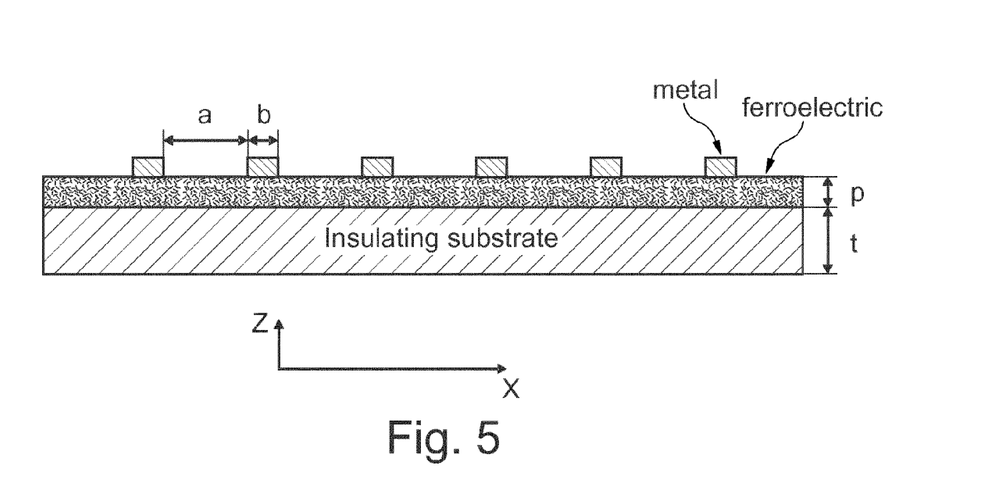
FIG. 5 illustrates a cross section of an example of embodiment according to the present invention.

With reference to FIG. 5, which illustrates some critical parameters that may be modified to optimize the bending performance of the illustrated actuator. These parameters includes the width b of the electrode, separation distance a between the positive and negative electrodes, thickness of the piezoelectric (ferroelectric) material p and thickness t of an insulating substrate, for example a glass cover. Further, the electrode configuration will span over a certain length of the ferroelectric substrate surface dependent on parameter values of the parameters a, b, and this may be provided for as a number of electrode repeat units (a+b), for example.

For the simplest case of a cantilever structure, assuming that the ferroelectric material between the electrodes (distance a) has a uniform polarization, the piezoelectric stress ($T_x$) in this region, along the length (x-axis) of the cantilever, can be written as:

$$T_x = e_{IDE} \cdot E \qquad (1)$$

wherein $e_{IDE}$ is the piezoelectric coefficient for the actuator patterned with an Interdigitated Electrode, and E is the applied field (v/a). This stress leads to a uniform bending between the fingers. The resultant displacement function, u(x), of the piezoelectric stress bending has a constant second derivative proportional to the applied electric field. A general formula for the curvature (c) can be given as:

$$\frac{d^2 u(x)}{dx^2} = c \qquad (2)$$

The periodicity of the Interdigitated Electrode in FIG. 5 is (a+b). Thus, we can write $x = n*(a+b) + y_n$ where $y_n$ varies between 0 and a+b, and n is the number of repeat electrode units (a+b).

We can therefore write:

$$\frac{d^2u(x)}{dx^2} = c \text{ if } 0 < y_n < a \quad (3)$$

$$\frac{d^2u(x)}{dx^2} = 0 \text{ if } a < y_n < a+b$$

Since the function u(x) must be continuous, the first derivative must be continuous as well. We therefore determine for the first derivative:

$$u'(x = n \cdot (a+b)) \equiv u'_n = u'_{n-1} + c \cdot a \quad (4)$$

$$u_n = u_{n-1} + u'_{n-1}(a+b) + \frac{1}{2}ca^2 + cb$$

$$u'_n = n \cdot ca$$

$$u_n = u_{n-1} + (n-1)ca(a+b) + \frac{1}{2}ca^2 + cb$$

$$u_n = \sum_1^n (n-1)ca(a+b) + \frac{1}{2}ca^2 + cab$$

$$= \frac{1}{2}n(n-1)ca(a+b) + \frac{n}{2}ca^2 + ncab$$

$$= \frac{1}{2}n^2ca^2 + \frac{1}{2}(n(n+1))cab$$

Denoting the last electrical connection as the N-th one, the sum is up to N(n=N):

$$u_N = \frac{cN^2a^2}{2}\left[1 + \frac{1}{2}\left(1 + \frac{1}{N}\right)\frac{b}{a}\right] \quad (5)$$

(Note that the sum is up to capital N, in correction of previous lines)

The result can be checked for b=0, where the deflection or bending force is obtained as expected as $$u_N = \frac{c}{2}N^2a^2$$

We can also verify some examples, which turn out to be correct:

$$u_1 = \frac{1}{2}ca^2 + ca \cdot b$$

$$u_2 = \frac{1}{2}ca^2 + ca \cdot b + ca \cdot (a+b) + \frac{1}{2}ca^2 + ca \cdot b = 2ca^2 + 3cab$$

$$u_3 = \frac{1}{2}ca^2 + ca \cdot b + ca \cdot (a+b) + \frac{1}{2}ca^2 + cab\ldots + 2ca \cdot (a+b) + \frac{1}{2}ca^2 + cab$$

$$= \frac{9}{2}ca^2 + 6ca \cdot b$$

According to an aspect of the present invention, it would be beneficial to have just one dead zone per radially oriented electrical connection between adjacent ring shaped electrodes. This may be achieved in an example of embodiment of the present invention by partitioning the membrane in as many segments as there are radially oriented connections. An example is disclosed in FIG. 8 where the radially oriented electrode 16 is connected to three rings (branches) via two interconnecting electrical connections 20, 21. The other electrode 17 is connected to two rings (branches) and there is therefore one interconnecting electrical connection 22. Therefore, there is only one dead zone per electrical connection which may be distributed across the surface of the lens body. This distribution of dead zones is configurable to provide a more uniform bending force distribution.

Mathematically, this means that in length section of L/N, one term $$\frac{1}{2}ca^2$$

is replaced by a term ca in the formula for the displacement.

The previous considerations dealt with the deflection of a membrane structure when no counter forces are involved. For a micro-tunable lens application, the lens body is deformed and reacts with a counter force due to elasticity of the flexible lens body.

Figure 6:
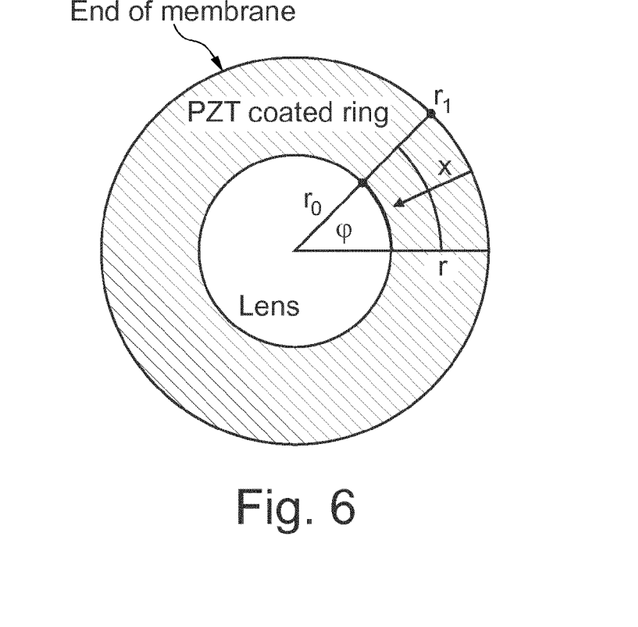
FIG. 6 illustrate an example of a piezoelectric element on a surface of a flexible lens body.

We may assume that the ring shape of the electrode is partitioned into segments as indicated in the FIG. 6.

The bending moment due to the piezoelectric effect can be approximated by the following equation if the thickness of an insulating glass layer ($=t_e$, e stands for elastic layer) is much larger than the PZT film thickness $t_p$. The moment per length is abbreviated as $\mu_p$.

$$\mu_p = \frac{1}{2}T_{pr}t_p t_{e'} \quad (7)$$

where $T_{pr}$ is the piezoelectric stress along the r or x direction. The factor ½ comes from the approximation that the neutral plane is in the centre of the glass layer. The moment from a line force p at the border of the lens ($r=r_0$, or x=L (L=length of cantilever=$r_1-r_0$) creates as well a bending moment. It is possible to introduce the assumption that it is a rectangular shaped cantilever, i.e. that the radius is large when compared to the cantilever length, and the angle φ is small enough. The ring shape may be partitioned into segments of angle φ. The moment at x is obtained as:

$$\mu_F = (L-x)p. \quad (8)$$

The deflection is obtained from the integration of the curvature (c, equation 1). The moment and the curvature are related by the moment of inertia I and the relevant elastic constant $\overline{Y}_e$ by:

$$\mu = \overline{Y}_e I \cdot c \quad (9)$$

I comes from the bending around the neutral axis, in the simplest case in the centre of the elastic plate, thus at $t_e/2$, from the condition that all moments sum up to zero:

$$\mu = \int_{-t_e/2}^{t_e/2} dz(\overline{Y}cz \cdot z) = \overline{Y}c\frac{1}{3}\frac{t_e^3}{4} = \overline{Y}\frac{1}{12}t_e^3 c \quad (10)$$

$$I = \frac{1}{12}t_e^3$$

If considering a plate of homogeneous thickness $t_e$, (note that the impact of the PZT film thickness on the inertial moment is omitted for simplicity), it is possible to evaluate the force at the inner border of the PZT ring. Then it is possible to assume that the force at $r_0$, or at x=L, is equal to the force needed to avoid the excursion of the PZT ring structure at $r_0$, or at the end of the cantilever. The excursion is given by the twofold integration of the curvature along a radial path from the fixation of the cantilever at $r_1$ to the end of the cantilever at $r_0$. Denoting with the coordinate x the axial direction in the inverse sense, we require:

$$\int_0^L dx \int_0^x c(\xi)d\xi = 0. \quad (11)$$

where $L=r_1-r_0$. If the glass plate has the same thickness and same properties everywhere, the term $\overline{Y}_e I$ is constant and the twofold integration of the moments must be zero. For the rectangular cantilever this means:

$$\int_0^L dx \int_0^x [\mu_P(\xi) + \mu_F(\xi)] = 0 \quad (12)$$

The first term gives the deflection without force. The deflection in absence of forces at the inner end of the cantilevers can be written as an integral (in contrast to the previous section):

$$u_{x=a} = \quad (13)$$

$$u_{r=ro} = \frac{1}{\overline{Y}_e I}\int_0^L dx \int_0^x (\mu_P(\xi))d\xi = \frac{1}{\overline{Y}_e I}\int_0^L \overline{\mu}_p(x)xdx = \frac{1}{2}\frac{1}{\overline{Y}_e I}\overline{\mu}_p L^2$$

$\overline{\mu}_p(x)$ is the average between x=0 and x=x. $\overline{\mu}_p$ is an average value that needs to be calculated according to equation 13. If $\mu_p$ is a constant, all averages are the same, and equal to this constant. One can evaluate this equation numerically, partitioning the length in sections. It is well seen that the important section is the first one. For instance if there are 6 sections, and $\mu$ is 0 or 1 per section, the integral in equation 13 should give 18 (=36/2) if all $\mu$'s are 1. It gives 17 if the last (at x=L) is zero, and 13.2 of the first (x=1) is zero.

The force term of the rectangular cantilever is calculated as:

$$\mu_F(x) = (L-x)p \quad (14)$$

force-term =

$$p\int_0^L dx \int_0^x (L-\xi)d\xi = p\int_0^L dx\left(Lx - \frac{1}{2}x^2\right) = p\frac{1}{2}L^3 - \frac{1}{6}L^3 = \frac{1}{3}pL^3$$

$$\frac{1}{2}\overline{\mu}_p L^2 + \frac{1}{3}pL^3 = 0$$

$$p = -\frac{3}{2}\frac{\overline{\mu}_p}{L}$$

The variation of the force is thus the same as the variation of the excursion.

The integral for the excursion can be transformed into a sum. Every element is thought to be a section between two fingers (assuming an average moment from the middle of a finger to the next middle of a finger).

$$\int_0^L dx \int_0^x \mu_p(\xi)d\xi = \sum_{n=1}^N \sum_{m=1}^n \mu_p(m) \quad (15)$$

With N=10, we obtain an integrated moment of 55 if all moments in the segments are equal to 1. If the first is zero, we get 45, if the second is zero we get 46, etc. if the last is zero we get 54. The first one is thus much more important than the last one. It is possible to provide a compensation by making the electric fields different, meaning narrower or larger electrode distances a+b (the electrode width needs also to be scaled down)

$$\mu_p \propto \frac{V}{a} \cdot \frac{a}{a+b} = \frac{V}{a+b} \quad (16)$$

There is a solution since we have N equations, and N unknowns. The double sum of equation can be written as one sum:

$$\sum_{n=1}^N \sum_{m=1}^n \mu_p(m) = N\mu_1 + (N-1)\mu_2 + \ldots (N-m+1)\mu_m + \ldots \mu_N \quad (17)$$

In every cantilever, one $\mu$ is zero. The sum should be the same for every cantilever which have equal displacements. The missing terms gives then the following equation for the condition that cantilever m and k have equal sums (all terms cancels except the two with m and k):

$$(N-m+1)\mu_m = (N-k+1)\mu_k \quad (18)$$

This is especially true if k=1 (first element starting $r_1$):

$$\mu_m = \frac{N}{N-m+1}\mu_1 \quad (19)$$

$$\mu_N = N \cdot \mu_1$$

$$\mu_2 = \frac{N}{N-1}\mu_1$$
...

One can verify that equation 19 is compatible with equation 17. It is clear that corrections by the electrode distance only would result in larger variations in electric fields. It is therefore possible to carefully alter electrode distribution scenarios in order to homogenize the force development at the end of the sections. In addition, for a complex problem of a soft lens deformation a finite element modeling is possible.

The difference between the first and the last element is quite large. With N cantilevers and N active sections in the Interdigitated Electrode configuration, we would have a factor of ten in difference. However, since the cantilevers are connected laterally this effect is smoothed out.

By for example utilizing finite element modeling, it is possible to model linear piezoelectric behaviour as a function of the electric field for the critical Interdigitated Electrode design parameters in order to determine an optimum design of a specific Interdigitated Electrode layer for a micro-tunable lens.

Example 1—Irregularly Segmented Circle

Figure 8:
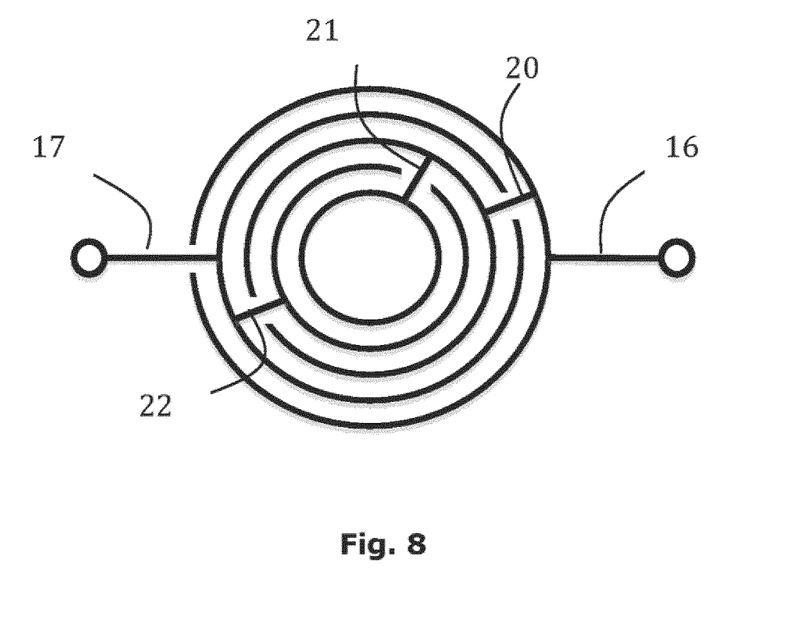
FIG. 8 illustrates an example of embodiment of the present invention.
Figure 9:
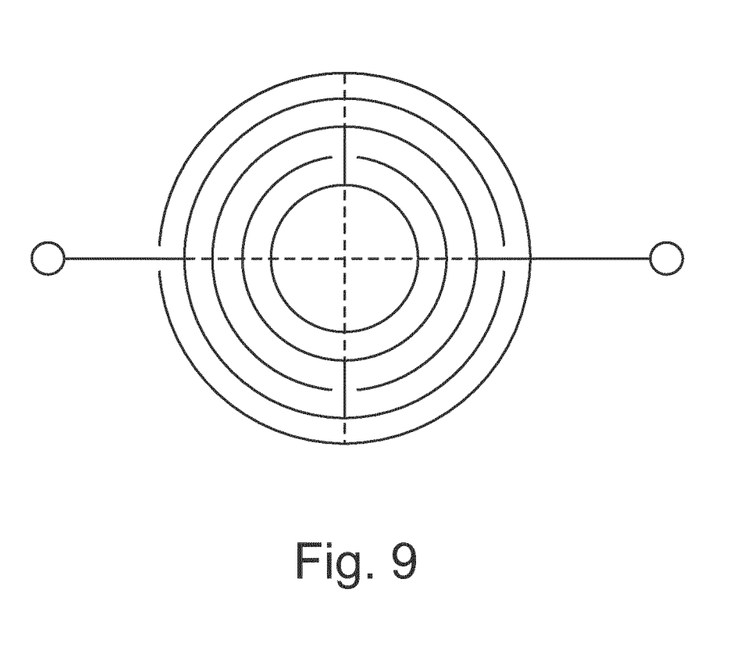
FIG. 9 illustrates an example of embodiment of the present invention.

The radial connections must be distributed in a geometric manner to obtain the desired effect of mitigating the effect of dead zones. For example, in order to achieve a uniform force distribution across the optical aperture area of the lens body, the radial oriented electrical connections between concentric partly ring-shaped electrodes of the piezoelectric elements have to be distributed evenly such that the 'radial dead zones' are balanced and a homogeneous force distribution may be the result. The Interdigitated Electrode for a circle is depicted in FIG. 8. Symmetrical positioning of the radial electrical connections may be achieved by segmenting the circle into a defined number of sectors, for example 4 quadrants as depicted FIG. 9, or by dividing the circle by angular degrees.

A non-uniform bending force distribution may be configurable if the electrodes are arranged in a non-symmetrical pattern about the central optical axis of the lens.

Example 2—Irregularly Segmented Polygon

Figure 10:
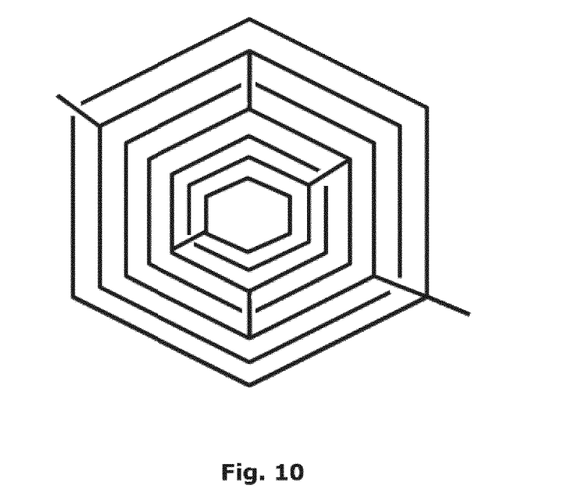
FIG. 10 illustrates an example of embodiment of the present invention.

The radial connections are distributed according to the symmetrical properties of a polygon, most typically placed at junctures between two sides of the polygon. Here a polygon with n equal to or greater than 8 is preferred. FIG. 10 illustrates the example of an Interdigitated Electrode pattern for a hexagon, where the radial connections are distributed symmetrically providing a uniform bending forces distribution.

Example 3—Sliced Circle with Regular Segmentation

Figure 11:
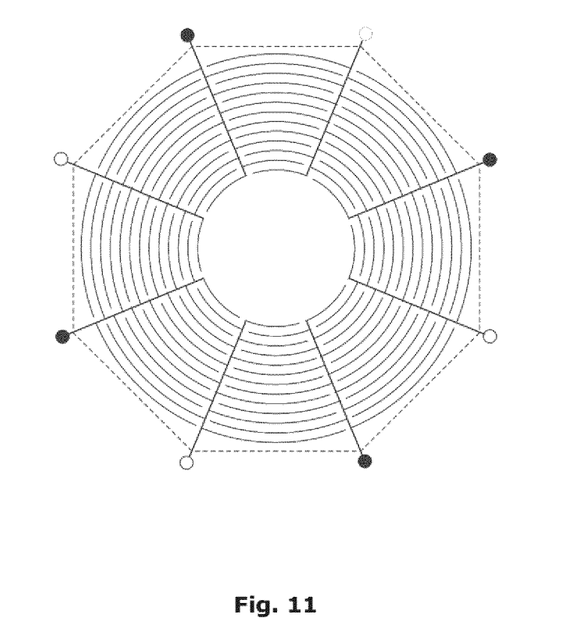
FIG. 11 illustrates an example of embodiment of the present invention.

A circular Interdigitated Electrode is segmented into an even number of equally sized 'slices' in order to evenly distribute the radial connections, cf. FIG. 11. Although a greater number of radial dead zones exist here, symmetrical force configuration about the central optical axis is possible.

FIG. 11 illustrates an example of an Interdigitated Electrode pattern for a circle divided into 8 sections, where the radial connections are distributed symmetrically.

In an example of embodiment of the present invention a piezoelectric actuator is arranged as a bimorph structure (i.e. a piezoelectric element on both sides of for example the insulating element, or a transparent elastic membrane substrate, for example a glass cover) in order to enable the actuator to operate in both directions perpendicular to a horizontal plane direction. This will provide a configurable control over the curvature provided for by the actuators, and depending on the positioning, size and thickness of the Interdigitated Electrode located on a top and bottom side of a membrane, a biasing of bending force direction is possible.

In another example of embodiment of the present invention, the occurrence of dead zones of the ferroelectric/piezoelectric actuator with Interdigitated Electrodes on a top surface may be reduced by introducing adjacent electrodes on both sides of the actuator layer, or by embedding the electrodes within the actuator layer.

According to another example of embodiment of the present invention, a process simplification is achieved by the fact that the piezoelectric layer may be deposited directly onto a buffer layer which is electrically insulating. Such a buffer layer should not be chemically reactive with the piezoelectric material, and should also minimize any diffusion between the two layers. Such a configuration removes the need for a costly bottom electrode such as a platinum layer. This process simplification removes one electrode layer compared with the standard parallel capacitor piezoelectric element (see FIGS. 1 and 2 for comparison).

Generally, it is within the scope of the present invention to have different arrangements of the electrodes with respect to the piezoelectric material. The electrodes can be located on top, or underneath, or on both sides of the piezoelectric material. Further, the electrode, piezoelectric material and membrane can be arranged in all different permutations of layers. It is further within the scope of the present invention that the step of providing an initial arrangement of the electrodes on the flexible lens body surface comprises arranging the structure of the electrode and piezoelectric material and membrane in one of the possible permutations of layers. These permutations comprises also the possibility to arrange stacks of piezoelectric elements.

According to an example of embodiment of the present invention, a system and a method thereof enabling identification of an Interdigitated Electrode configuration comprises using a program with a graphical interface providing configurable graphical manipulations of an Interdigitated Electrode configuration on a surface of a flexible lens body, wherein data output describing the manipulated geometry of a specific Interdigitated Electrode configuration may be transferred to a simulator system comprising a model of the physics of a specific flexible lens body. The physics of the piezoelectric actuators with Interdigitated Electrodes on the surface is also modeled. In this manner it is possible to provide a starting configuration of a specific electrode configuration and then simulate the result, then go back and make a possible change in the configuration and then simulate again. Through such an iterative process it will be possible to check the effect of a specific geometrical arrangement of piezoelectric actuators with Interdigitated Electrode configuration, and also to be able to repeatably refine and iterate configurations to reach a target measure for the bending force distribution. This target measure may be a measure of optical properties of a lens body simulated in a simulator, which for example can reflect how even the bending forces are distributed on the surface of the lens, or if a certain defined nonuniform bending force distribution is achieved providing a correction of a lens flaw or error, and/or if a certain optical power has been reached.

The physics simulation tool COMSOL described on the link http://www.comsol.com/ comprises a simulator system that can be used in an electrode configuration process as described above. The system comprises multi physics modeling tools than makes it simple to build a physical simulation model of a flexible lens body with arranged piezoelectric actuators configurable with Interdigitated Electrodes. Further, the COMSOL system has respective interfaces for receiving output data from a plurality of different Computer Aided Design systems that can be connected automatically with a model of a physical system. In another example of embodiment of the present invention, a program module provides automatic manipulations of geometries of electrode configurations and output data in a selected Computer Aided Design tool format as input to the simulator model.

The COMSOL system provides also tools for formatting reported results from a simulation run that can be used to provide a change of a configuration of electrodes.

According to an example of embodiment of the present invention, a method of arranging Interdigitated Electrodes of piezoelectric material on a surface of a flexible lens body comprises building a simulation model executable in a computer system of an initial arrangement of the Interdigitated Electrodes on the flexible lens body surface. The initial arrangement may be as depicted in FIG. 7. Further, the initial arrangement may also comprise splitting electrodes in electrical connections and distributing electrical connections of the Interdigitated Electrodes at random across the surface of the flexible lens body surface. The distribution may also be according to a defined symmetrical geometrical distribution, or via a defined irregular geometrical distribution. It is also within the scope of the present invention to insert extra Interdigitated Electrodes in the configuration, or removing an Interdigitated Electrode if necessary to achieve a target measure for the bending force distribution.

The method comprises further transferring the initial defined configuration of the Interdigitated Electrodes to a simulator, and then perform iteration steps, wherein each iteration step terminates with comparing the resulting bending force distribution with (for example indirectly by simulating optical characteristics of the configuration on the lens surface), a target measure for the bending force distribution, for example how even the bending of the surface is.

If the target measure is reached the simulation may terminate and the identified Interdigitated Electrode configuration may be applied in a manufacturing process as known to a person skilled in the art.

According to an example of embodiment of the present invention an iteration step of the example of method above may comprise selecting at random an electrical connection between concentric partly ring-shaped branches of a first radially oriented electrode part and move the electrical connection in a randomly selected direction around a circle shaped path of the partly ring-shaped branches. Further, a corresponding electrical connection of a second radially oriented electrode part is moved to a diagonally opposite located location on the circle shaped path.

According to another example of embodiment of the present invention an electrical connection being moved is moved in such a manner to provide a balancing of the effect of the dead zone beneath the electrical connection itself.

With reference to FIG. 8, the electrical connection 21 of the radially oriented electrode 16 has been moved towards the point B depicted in FIG. 7 which have a maximum bending force extending from the point A which has a minimum bending force due to the dead zone. How far one should move the electrical connection 21 can be selected by defining a fraction of the distance, or by the maximum bending force in point B. The movement may be guided by a definition of a local bending force target measure. It is also within the scope of the present invention of using mean values or other statistical measures as target measures.

According to an example of embodiment of the present invention, typical thicknesses of concentric partly ring-shaped electrodes of the piezoelectric elements are built up by an adhesion/seed layer of $ZrO_2$, or $TiO_2$ in the range of 10 nm to 1 µm thickness, typically 30 nm. PZT material is typically deposited in a range of 0.5 to 4 µm, typically 2 µm.

Electric connectors of the radially configured electrode parts are typically a metal electrode (e.g. Au/Al/Ag etc.) with a thickness in the range of 30 nm to 1 µm, typically 100 nm.

Generally it is advisable to make the electric connectors substantially thinner than the thickness of the concentric partly ring-shaped electrodes of the piezoelectric elements. Any possible unwanted bending forces between electric connectors of the radially configured electrode parts will then be of no significance for the total bending force distribution on the surface of the flexible lens body.

According to another example of embodiment of the present invention, the flexible lens body may be constituted by materials like glass, or other transparent materials.

The invention claimed is:

1. A method of optimizing a piezoelectric actuator arrangement of a micro-tunable lens body, the method comprising:
    building a simulation model executable in a computer system of an initial arrangement of Interdigitated Electrodes on a flexible lens body surface by:
        arranging by a computer program concentric circular or concentric polygonal shaped piezoelectric elements comprising electrodes configured on a surface of a piezoelectric material deposited on a surface of a flexible lens body, thereby constituting piezoelectric actuators on the surface of the flexible lens body around a central located transparent part of the lens body,
        wherein the piezoelectric actuators comprise a first positive electrode and a second negative electrode, each comprising a radially configured electrode part connected to branches of concentric circular or polygonal shaped electrodes surrounding the transparent part of the lens body,
        wherein branches of the positive electrode and negative electrode are arranged sequentially with opposite polarity and in a parallel configuration, with respective different distances from the transparent part or optical axis of the lens body, and
        wherein the method further comprises transferring the simulation model to a simulator by applying the simulation model executable in a computer system, the model being adapted to simulate a resulting bending force distribution of the lens body surface according to simulated applied voltages to the electrodes of the piezoelectric elements in the initial arrangement of the electrodes on the flexible lens body surface, wherein the method further comprises performing an iterative process further comprising:

modifying the initial arrangement of the electrodes of the piezoelectric elements by applying a first electrical connection between branches of the first concentrically configured electrode part and applying a first electrical connection between branches of the second concentrically configured electrode part, wherein the simulation model is applied to re-simulate a resulting bending force distribution of the lens body surface according to simulated applied voltages to the electrodes of the piezoelectric elements, and when applying an electrical connection between two branches of one radially oriented electrode part, an opening in the branch of opposite polarity of the other radially oriented electrode part being arranged in between the two branches is provided for, thereby allowing the passing of the electrical connection, then continuing the iterative process by modifying the arrangement of the electrodes and applying further electrical connections between branches of the first electrode part and between branches of the second electrode part of the piezoelectric elements, and wherein the simulation model is applied in each iterative step to re-simulate a resulting bending force distribution of the lens body surface according to simulated applied voltages to the electrodes of the piezoelectric elements, wherein each iteration step comprises:

a) randomly selecting an electrical connection of the first electrode part and moving the connection in a randomly selected direction around the branches to which the electrical connection is connected to, b) when the electrical connection is moved, an opening arranged in the second electrode part arranged between the two branches of the first electrode part, which the electrical connection of the first electrode would be passing when moved, then moving the electrical connection together with the opening to a randomly selected location, c) randomly selecting an electrical connection of the second electrode part and moving the electrical connection in a randomly selected direction around the branches to which the electrical connection is connected to, d) when the electrical connection is moved, an opening arranged in the first electrode part arranged between the two branches of the second electrode part, which the electrical connection of the second electrode would be passing when moved, then moving the electrical connection together with the opening to a randomly selected location, and e) re-simulate a resulting bending force distribution of the lens body surface according to simulated applied voltages to the electrodes of the piezoelectric elements in accordance with the configuration of electrodes provided for by performing steps a) to d), and comparing the resulting bending force distribution with a target measure for the bending force distribution, wherein the iterative process comprises continuing steps a) to e) until the bending force distribution of the lens body is within a predetermined tolerance with respect to the defined target measure for the bending force distribution of the lens body, or alternatively stopping after a predetermined maximum number of iterations, and wherein after the bending force distribution of the lens body is within the predetermined tolerance with respect to the defined target measure for the bending force distribution of the lens body, or alternatively after the predetermined maximum number of iterations, the method further comprises physically providing a micro-tunable lens comprising piezoelectric actuators configured in a pattern on the surface of the micro tunable lens according to the configuration of electrodes provided for by steps a) to e).

2. The method according to claim 1, wherein a thickness of the radially oriented electrode parts above the surface of the piezoelectric material is arranged to be substantially thinner than the thickness of the corresponding branches of the electrodes above the piezoelectric material.

3. The method according to claim 1, wherein if a target value of the lens bending force distribution is not reached when the iterative steps a) to e) terminates, then change the configuration of the piezoelectric elements by inserting an extra branch of concentric circular or polygonal shaped electrodes in the first electrode and/or second electrode.

4. The method according to claim 1, wherein if a target value of the lens bending force distribution is not reached when the iterative steps a) to e) terminates, then change the configuration of the piezoelectric elements by removing a branch of concentric circular or polygonal shaped electrodes in the first electrode and/or second electrode.

5. The method according to claim 1, wherein the step of selecting a random location for the electrical connection of the first electrode part in step a) further comprises:

f) calculating in the simulator the bending forces on the surface of the flexible lens body around the randomly selected location of the electrical connection of the first electrode part, and compare this value with a maximum bending force provided for with the initial configuration of the initial piezoelectric electrode configuration, g) moving the electrical connection of the first electrode part further, either back or forth along the branch direction around the randomly selected location, then calculating a next local bending force distribution around the further selected location of the electrical connection of the first electrode part, and comparing the next local bending force distribution with a local defined target value, and h) continuing iterations of the further location in step f) and g) until the local target of the bending force distribution has been reached.

6. The method according to claim 1, wherein the target bending force distribution for the iteration process is a uniform distribution of the bending forces on the flexible lens body surface.

7. The method according to claim 1, wherein the target bending force distribution for the iteration process is a non-uniform distribution of the bending forces on the flexible lens body surface, wherein the non-uniform distribution of the bending forces is providing a pre-selected curvature on the surface of the flexible lens body.

8. The method according to claim 5, wherein the local target distribution for the bending forces is a mean value of the local bending forces in a defined area around the location of the electronic connection of the first electrode part, and wherein the local target mean value is defined as a fraction of the maximum bending force provided for by the initial configuration of the piezoelectric electrodes.

9. The method according to claim 1, further comprising the step of arranging further radially oriented electrode parts with connection to corresponding concentric ring-shaped branches of electrodes in the initial configuration of the flexible lens body, wherein the calculation of the bending force distribution comprises applying respective different voltage values on the respective radially oriented electrode parts.

10. The method according to claim 1, wherein the electrical connections of the first radially oriented electrode part and the second radially oriented electrode part both are distributed across the surface of the flexible lens assembly according to a regular geometrical pattern.

11. The method according to claim 1, wherein the electrical connections of the first radially oriented electrode part and the second radially oriented electrode part both are distributed across the surface of the flexible lens assembly according to a defined irregular geometrical pattern.

12. The method according to claim 1, wherein the piezoelectric elements are arranged on top of a flexible transparent membrane resting on top of the surface of the flexible lens body.

13. The method according to claim 12, wherein the piezoelectric elements are arranged as a bimorph structure on both sides of the flexible transparent membrane resting on top of the flexible lens body.

14. The method according to claim 1, wherein the piezoelectric electrode configuration is within the flexible lens body surface.

15. The method according to claim 12, wherein the piezoelectric electrodes are arranged as electrodes on both sides of the flexible transparent membrane resting on top of the flexible lens body.

16. The method according to claim 12, wherein the piezoelectric electrodes are within the surface of the transparent flexible membrane.

17. The method according to claim 1, wherein the flexible lens body comprises glass, or a transparent material.

* * * * *